(12) United States Patent
Chiu

(10) Patent No.: US 6,834,093 B1
(45) Date of Patent: Dec. 21, 2004

(54) FREQUENCY COMPARATOR CIRCUIT

(75) Inventor: Hon K. Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/804,866

(22) Filed: Mar. 19, 2004

(51) Int. Cl.[7] .............................................. H03K 21/00
(52) U.S. Cl. .............................. 377/39; 377/50; 327/43; 327/48; 327/49
(58) Field of Search ....................... 377/39, 50; 327/43, 327/48, 49

(56) References Cited

U.S. PATENT DOCUMENTS 5,929,670 A * 7/1999 Yamashita ................... 327/116
6,563,346 B2 * 5/2003 Abbiate et al. ............... 327/48
6,642,747 B1   11/2003 Chiu

* cited by examiner

*Primary Examiner*—Margaret R. Wambach
(74) *Attorney, Agent, or Firm*—Darby & Darby P.C.; Matthew M. Gaffney

(57) ABSTRACT

A frequency comparator circuit is configured to compare whether the frequency of two input signals are within a tolerance of each other. The frequency comparator circuit includes two counter circuits, an AND gate, and a frequency detector circuit that is configured to provide two reset signals. The two counter circuits are arranged to be clocked by a respective one of the two input signals, and further arranged to be reset by a respective one of the two reset signals. Further, the AND gate is arranged to perform an AND function on the overflow outputs of the first and second counter circuits to provide an status signal. If the status signal is high, the difference in frequency between the two input signals is less than the tolerance. If the status signal is low, the difference in frequency between the two input signals exceeds the tolerance.

20 Claims, 3 Drawing Sheets

US 6,834,093 B1

FREQUENCY COMPARATOR CIRCUIT

FIELD OF THE INVENTION

The invention is related phase-locked loops, and, in particular, to a frequency comparator circuit that includes a frequency detector circuit.

BACKGROUND OF THE INVENTION

Phase-locked loop (PLL) circuits are useful in many electronic systems. For example, PLL circuits may be used for master clock generation for a microprocessor system, clock generation for a sampling clock in an analog-to-digital conversion system, clock generation for data recovery in a low-voltage differential signal (LVDS) driver/receiver system, as well as numerous other applications.

PLL applications typically provide an output clock signal by comparing the output clock signal to a reference clock signal. A phase-frequency detector (PFD) circuit is often employed to provide a raw control signal to a loop filter. The phase-frequency detector circuit provides the raw control signal in response to comparing the phase and frequency of the output clock signal to the reference clock signal. The loop filter often is a low-pass filter (LPF) that is arranged to provide a smoothed or averaged control signal in response to raw control signal. Typically, a voltage-controlled oscillator (VCO) is arranged to receive the control signal from the loop filter. The VCO produces the clock signal in response to the control signal such that the frequency of the clock is varied until the phase and frequency of the clock signal are matched to the reference clock signal.

A PLL circuit may include a PFD circuit that provides UP and DOWN signals in response to the comparison between the output clock signal and the reference clock signal. The UP and DOWN signals are dependent on both the phase and frequency of the output and reference clock signals. The UP signal is active when the frequency of the output clock signal is lower than the reference signal, while the DOWN signal is active when the frequency of the output clock signal is determined to be higher than the reference signal. Similarly, the UP signal is active when the phase of the output clock is lagging behind the phase of the reference clock, and the DOWN signal is active when the phase of the output clock is leading the phase of the reference clock.

BRIEF DESCRIPTION OF THE DRAWINGS

Non-limiting and non-exhaustive embodiments of the present invention are described with reference to the following drawings, in which.

DETAILED DESCRIPTION

Figure 1:
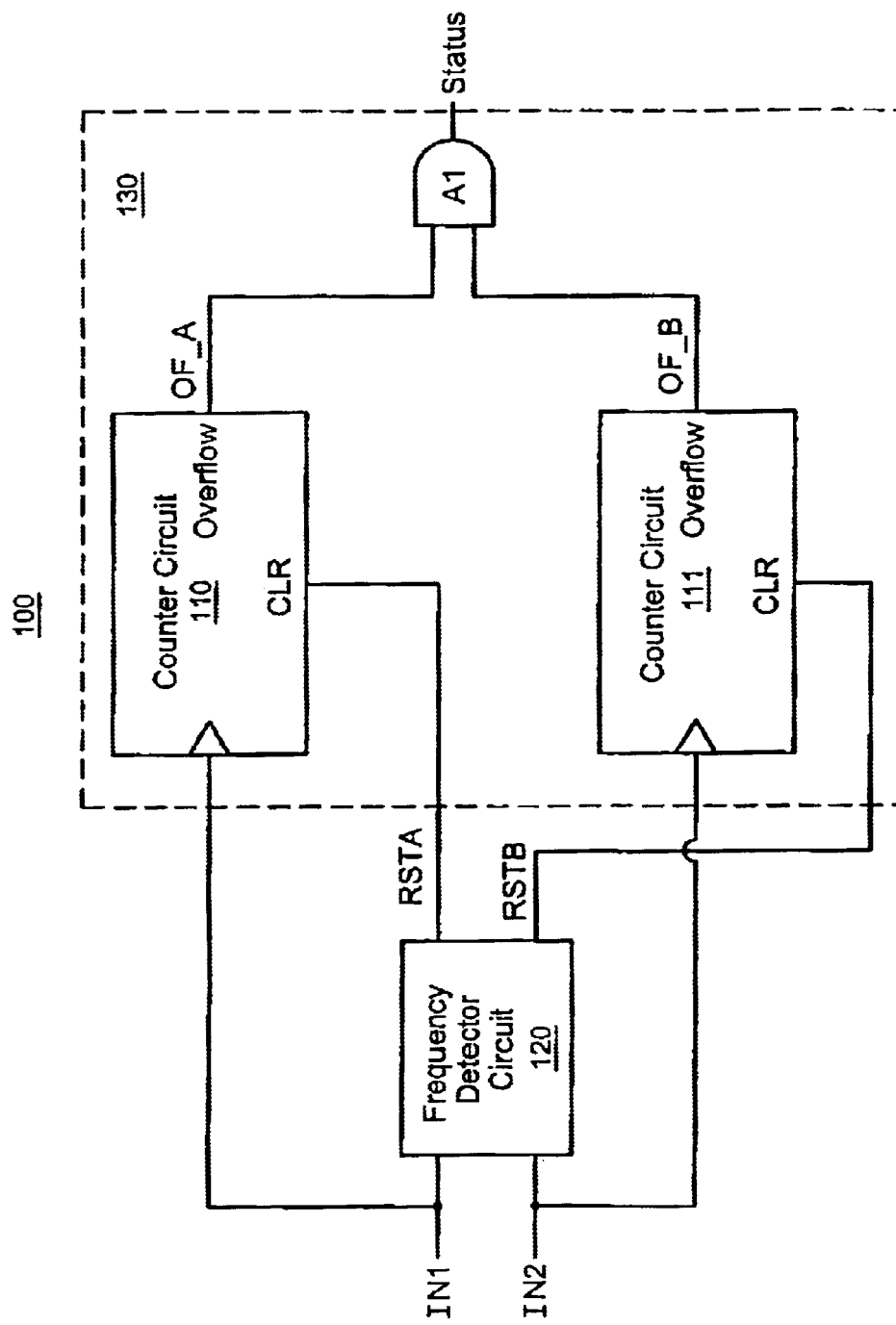
FIG. 1 illustrates a block diagram of an embodiment of a frequency comparator circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The term "connected" means a direct electrical connection between the items connected, without any intermediate devices. The phrase "in one embodiment," as used herein does not necessarily refer to the same embodiment, although it may. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a frequency comparator circuit that is configured to compare whether the frequency of two input signals are within a tolerance of each other. The frequency comparator circuit includes two counter circuits, an AND gate, and a frequency detector circuit that is configured to provide two reset signals. The two counter circuits are arranged to be clocked by a respective one of the two input signals, and further arranged to be reset by a respective one of the two reset signals. Further, the AND gate is arranged to perform an AND function on the overflow outputs of the first and second counter circuits to provide a status signal. If the status signal is high, the difference in frequency between the two input signals is less than the tolerance. If the status signal is low, the difference in frequency between the two input signals exceeds the tolerance.

FIG. 1 illustrates a block diagram of an embodiment of frequency comparator circuit 100. Frequency comparator circuit 100 includes frequency detector circuit 120 and tolerance circuit 130. An embodiment of tolerance circuit 130 includes counter circuit 110, counter circuit 111, and AND gate A1.

In operation, frequency detector circuit 120 is configured to provide a first reset signal (RSTA) and a second reset signal (RSTB) from a first input signal (IN1) and a second input signal (IN2).

In one embodiment, frequency detector circuit 120 is configured to provide signals RSTA and RSTB as follows. If fIN1>fIN2, signal RSTA has a first parameter that is related to fIN1−fIN2, where fIN1 and fIN2 are the frequencies that are associated with signals IN1 and IN2, respectively. Alternatively, if fIN1<fIN2, signal RSTB has a second parameter that is related to fIN2−fIN1.

In one embodiment, if fIN1≧fIN2, fRSTB is substantially zero, where fRSTB is the frequency that is associated with signal RSTB. In one embodiment, if fIN1≦fIN2, fRSTA is substantially zero, where fRSTA is the frequency that is associated with signal RSTA.

In one embodiment, at least if 2*fIN2>fIN1>fIN2, fRSTA is substantially equal to fIN1−fIN2. In one embodiment, at least if 2*fIN1<fIN2<fIN1, fRSTB is substantially equal to fIN2−fIN1. The difference between fIN1 and fIN2 is the beat frequency of signals IN1 and IN2.

Tolerance circuit 130 is configured to provide a status signal (Status) from signals IN1, IN2, RSTA, and RSTB.

Further, tolerance circuit 130 is configured to provide signal Status such that signal Status corresponds to a first logic level if the difference between the fIN1 and fIN2 are within a tolerance window, and to a second logic level otherwise. In one embodiment, tolerance circuit 130 is arranged to provide signal Status as follows.

Counter circuit 110 is arranged to receive signal IN1 at a clock input of counter circuit 110, and counter circuit 111 is arranged to receive signal IN2 at a clock input of circuit 111. Further, counter circuit 110 is arranged to increment a first count value when a positive edge occurs in signal IN1. Similarly, counter circuit 111 is arranged to increment a second count value when a positive edge occurs in signal IN1. Although a positive edge triggered condition is described, in other embodiments, counter circuits 110 and 111 may be triggered by a negative edge, level-triggered, and the like.

Additionally, counter circuit 110 is arranged to reset the first count value (e.g. to zero) if signal RSTA is asserted. Similarly, counter circuit 111 is arranged to reset the second count value (e.g. to zero) if signal RSTB is asserted.

Further, counter circuit 110 is configured to provide a first overflow signal (OF_A) at an overflow output such that signal OF_A is asserted if counter circuit 110 overflows. Similarly, counter circuit 111 is configured to provide a second overflow signal (OF_B) at an overflow output of counter circuit 111 such that signal OF_B is asserted if counter circuit 111 overflows.

In one embodiment, counter circuit 110 overflows if fIN1<fIN2+tol1, and counter circuit 111 overflows if fIN2<fIN1+tol2. Accordingly, in this embodiment, counter circuits 110 and 111 both overflow if fIN1-fIN2<tol1 and fIN2-fIN1<tol2. Also, AND gate A1 is arranged to provide signal Status by performing an AND function on signals OF_A and OF_B. Accordingly, signal Status has a high logic level if fIN1 and fIN2 are within the tolerance window of each other, and has a low logic level otherwise. In other embodiments, AND gate A1 may be replaced with another circuit that is configured to provide signal Status using the same truth table as an AND gate, and the like. In one embodiment, tol1 is substantially given by fIN1/(M1*[fIN1-fIN2]), where M1 is the maximum count value of counter circuit 110. Similarly, in one embodiment, tol2 is substantially given by fIN2/(M2*[fIN2-fIN]), where M2 is the maximum count value of counter circuit 111.

In one embodiment, tol1 and tol2 provide the tolerance window, where tol1 is an upper tolerance value for fIN1, and tol2 is a lower tolerance value for fIN1.

In one embodiment, frequency comparator circuit 100 may used for charge pump control in a phase-locked loop. In one embodiment, if signal Status is high, the charge pump provides nominal current. In this embodiment, if signal Status is low, the charge pump current is increased to speed up acquisition time.

Figure 2:
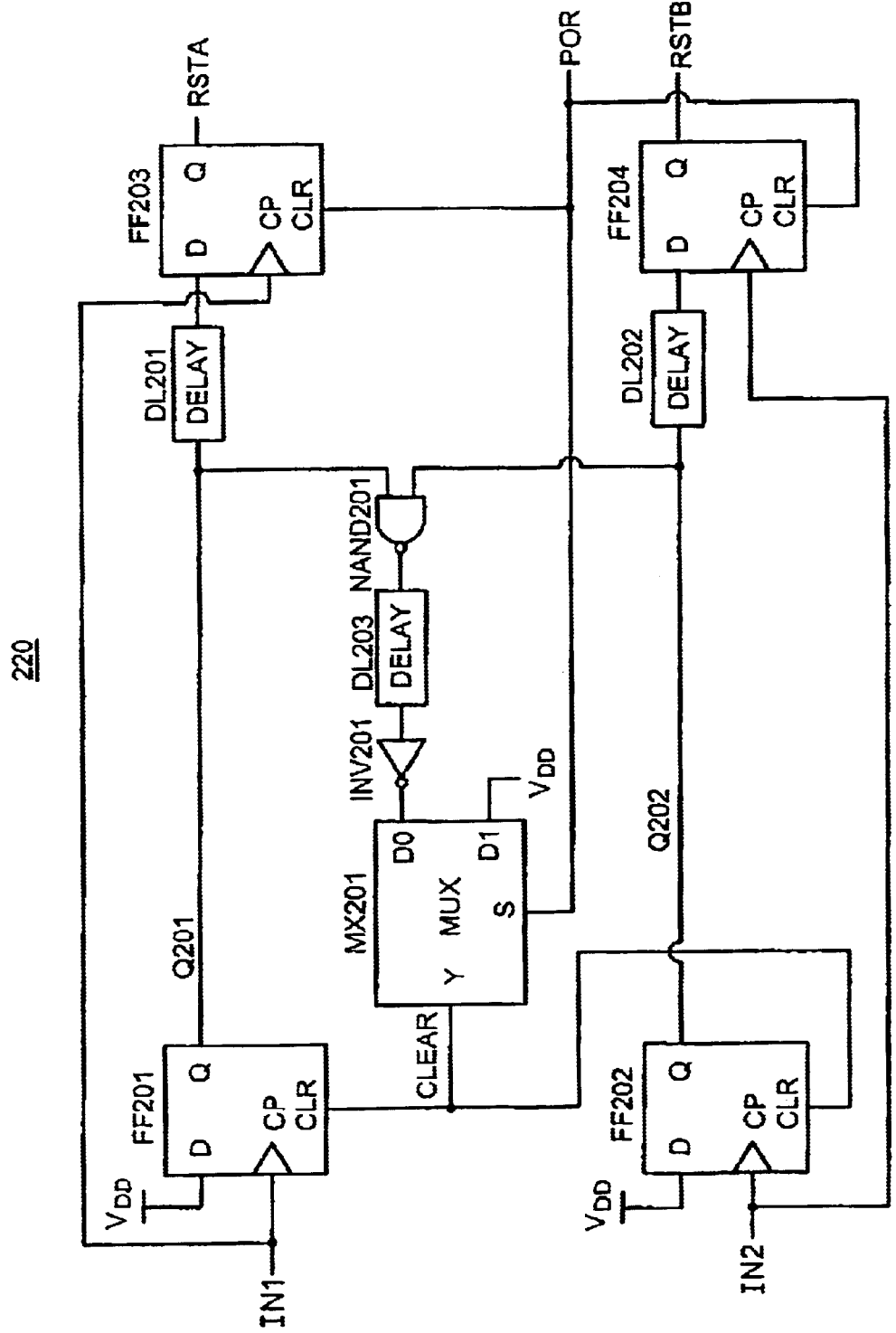
FIG. 2 shows a block diagram of an embodiment of the frequency detector circuit of FIG. 1.

FIG. 2 shows a block diagram of an embodiment of frequency detector circuit 220. Frequency detector circuit 220 may operate in a substantially similar manner as frequency detector circuit 120, and may operate differently in some ways. Frequency detector circuit 220 includes flip-flops FF201–FF204 and a clear logic circuit. In one embodiment, the clear logic circuit includes delay circuits DL201–DL203, NAND gate NAND201, inverter INV201, and multiplexer MX201.

The clear logic circuit may be arranged to activate a clear signal (CLR) if signal Q301 and signal RSTA correspond to a first logic level, and arranged to deactivate signal CLEAR if at least one of signal Q301 and signal RSTA corresponds to a second logic level. FF201 may be arranged to set signal Q301 to the first logic level in response to signal IN1 if signal CLEAR is deactivated, and arranged to reset signal Q301 to the second logic level if signal CLEAR is activated. FF202 may be arranged to set signal RSTA to the first logic level in response to signal IN2 if signal CLEAR is deactivated, and arranged to reset signal RSTA to the second logic level if signal CLEAR is activated. FF203 may be arranged to activate signal RSTA in response to signal IN1 if signal Q301 corresponds to the first logic level, such that signal RSTA is activated if signal IN1 pulses twice before signal CLEAR is activated. FF204 may be arranged to activate signal RSTB in response to signal IN2 if signal RSTA corresponds to the first logic level, such that signal RSTB is activated if signal IN2 pulses twice before signal CLEAR is activated.

Frequency detector circuit 220 is arranged such that signals RSTA and RSTB are dependent on fIN1 and fIN2, and such that signals RSTA and RSTB are substantially independent of the phases of signals IN1 and IN2.

If $fIN1 \geq fIN2$, fRSTB is substantially zero. Similarly, if $fIN1 \leq fIN2$, fRSTA is substantially zero.

If $2*fIN2>fIN1>fIN2$, then fRSTA is substantially given by fIN1-fIN2, and the duty cycle of signal RSTA is substantially 50%. If $fIN1>2*fIN2$, signal RSTA behaves in a similar manner, except that, occasionally, a pulse of signal RSTA has a pulse duration of 2/fIN1 instead of 1/FIN1. If $fIN1>>fIN2$, fRSTA is substantially the same as fIN2, and the duty cycle of signal RSTA is substantially given by (fIN1-fIN2)/fIN1.

Similarly, if $2*fIN1>fIN2>fIN1$, then fRSTB is substantially given by fIN2-fIN1, and the duty cycle of signal RSTB is substantially 50%. If $fIN2>2*fIN1$, RSTB behaves in a similar manner, except that, occasionally, a pulse of signal fRSTB has a pulse duration of 2/fIN2 instead of 1/FIN2. If $fIN1<<fIN2$, fRSTB is substantially the same as fIN1, and the duty cycle of signal RSTB is substantially given by (fIN2-fIN1)/fIN2.

Referring back to FIG. 1, in one embodiment, circuit 100 includes counter circuits 110 and 111, further includes frequency detector circuit 220 as an embodiment of frequency detector circuit 120, and counter circuits 110 and 111 arc both C bit counters. In this embodiment, if fIN1 and fIN2 are within a $1/2^C$ tolerance of each other, signal Status is high. Otherwise, signal Status is low. This may be more readily understood through the following mathematical calculations.

If $2*fIN2>fIN1>fIN2$, in order for a pulse to occur in signal RSTA for a duration of (N−1) pulses of signal IN2, at least N pulses must occur in signal IN1. The Nth pulse of signal IN1 must happen sooner than the (N−1)th pulse of signal IN2 in order to propagate a logic 1 at signal RSTA (i.e. two consecutive pulses of signal IN1 with no pulse of signal IN2 in between).

Accordingly, N*TA<(N−1)*TB , where TA and TB are the periods of signal IN1 and signal IN2 respectively.

TB<N*TB−N*TA

TB/(TB−TA)<N (1/fIN2)/(1/fIN2−1fIN1)<N fIN1/(fIN1−fIN2)<N (fIN1−fIN2)/fIN1>1/N, for generating a pulse at signal RSTA during the (N)th pulse of signal IN1, i.e. (fIN1−fIN2)/fIN1≤1/N, for no pulse to be generated at signal RSTA during the (N)th pulse of signal IN1.

For example, if C is 5, 32 pulses of signal IN1 can overflow the counter. However, if there is one pulse of signal RSTA before 32 consecutive pulses of signal IN1 occur, counter 110 does not overflow. If fIN1>2*fIN2, signal IN1 does not remain low long enough for counter 110 to overflow. Accordingly, if (fIN1−fIN2)/fIN1≦1/32, counter circuit 110 overflows.

Similarly, if (fIN2−fIN1)/fIN2≦1/32, counter circuit 111 overflows. If counter circuits 110 and 111 both overflow, fIN2 and fIN1 are similar, within ±1/32 tolerance. If counter circuits 110 and 111 both overflow, signal Status corresponds to logic 1.

The time duration, TRSTA, between two single pulses of signal RSTA if fIN1 and fIN2 are close and fIN1>fIN2, is given by

TRSTA/TA−TRSTA/TB=1

TRSTA*fIN1−TRSTB*fIN2=1
TRSTA=1/(fIN1−fIN2)
fRSTA=(fIN1−fIN2)

Figure 3:
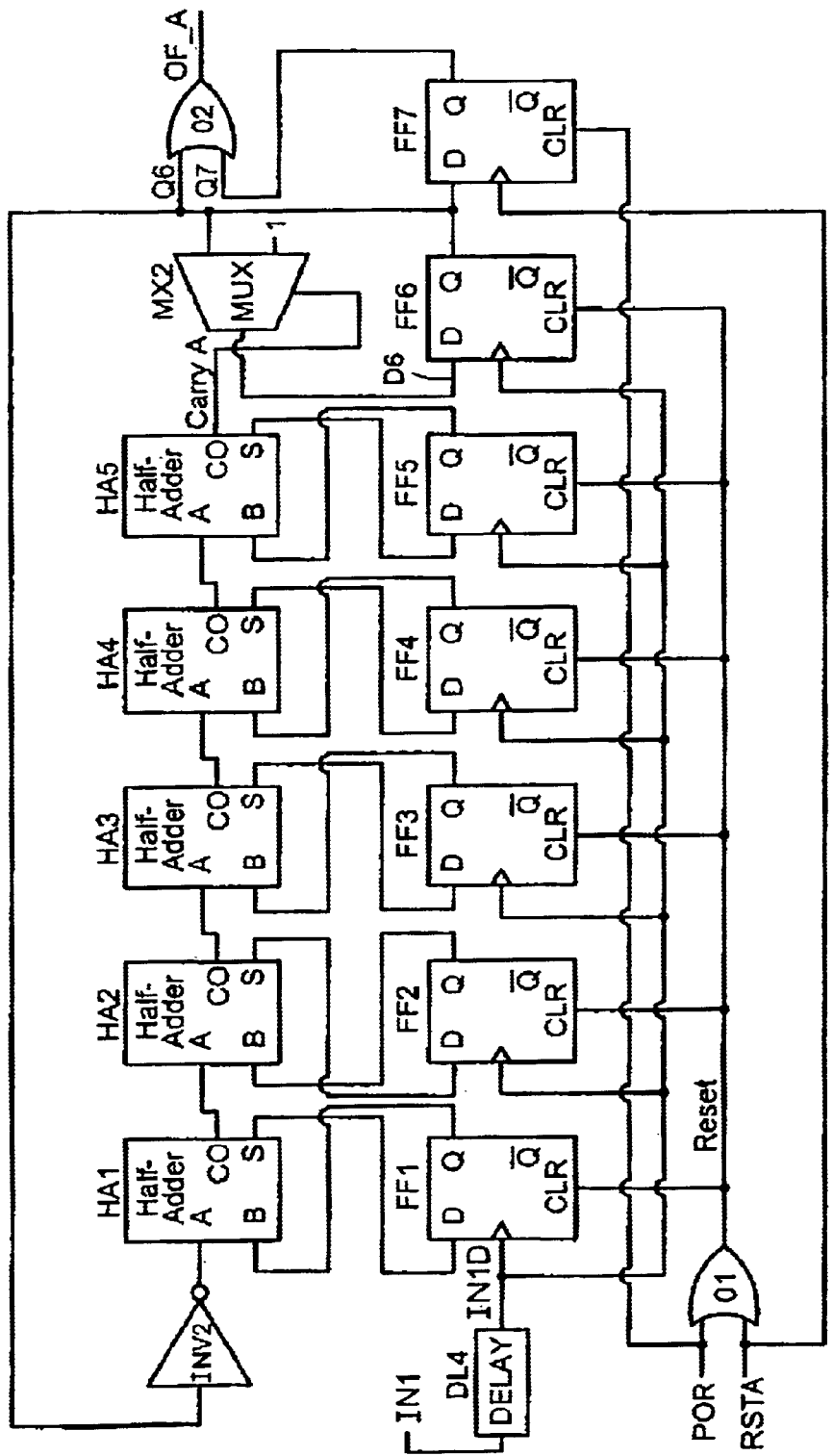
FIG. 3 illustrates a block diagram of an embodiment of one of the counter circuits of FIG. 1, arranged in accordance with aspects of the invention.

FIG. 3 illustrates a block diagram of an embodiment of counter circuit 310. Counter circuit 310 may operate in a substantially similar manner as counter circuit 110, and may operate differently in some ways. Counter circuit 111 may be arranged in a substantially similar manner to counter circuit 310. Counter circuit 310 may include flip-flops FF1–FF7, half-adders HA1–HA5, OR gates O1–O2, inverter INV2, multiplexer MX2, and delay circuit DL4.

Delay circuit DL4 is configured to provide signal IN1D from signal IN1. FF1–FF5 are arranged as a register that is configured to store the first count value. Additionally, the register is arranged to be clocked by signal IN1D. HA1–HA5 and INV2 are arranged as a look-ahead logic circuit. Also, OR gate circuit O1 is configured to provide signal Reset from signal POR and signal RSTA.

FF6 and MX2 are arranged to operate as follows. MX2 is arranged to provide signal D6 from signal Q6 such that, when FF6 is clocked, signal D6 has the same logic level as signal Q6 if signal carryA is low, and such that signal D6 is high if signal carryA is high. Signal carryA is high only if counter 310 overflows. Additionally, Q6 is reset to low if signal Reset is high. Accordingly, Q6 is set high only when counter circuit 310 overflows, and only remains high until signal Reset is high.

FF7 is arranged to store the overflow condition. Also, OR gate O2 is arranged to provide signal OF_A such that signal OF_A is high if either Q6 or Q7 are high. If the overflow condition occurs, carryA changes to high, which in turn causes Q6 to change to high, as previously described. Since Q6 is high, OF_A is high. Next, when signal Reset changes to high, Q6 is changed to low, and Q7 is changed to high. At this point, OF_A remains high, since Q7 is high. Q7 remains high until the next leading edge of signal Reset, which causes Q7 to change back to low.

As discussed, FF7 and OR gate O2 are used to temporarily store the overflow condition. If fIN1 is greater than fIN2, even if signal fIN1 is very close to fIN2, signal RSTA still has an occasional pulse. FF7 and OR gate O2 are arranged to prevent Status from immediately changing to low if this happens.

Although one embodiment of counter circuit 310 is described above for illustrative purposes, other embodiments of counter circuit 310 are within the scope of the invention.

The above specification, examples and data provide a description of the manufacture and use of the composition of the invention. Since many embodiments of the invention can be made without departing from the spirit and scope of the invention, the invention also resides in the claims hereinafter appended.

What is claimed is:
1. A frequency comparator circuit, comprising:
   a detector circuit that is configured to provide first and second reset signals from first and second input signals such that:
      if a first frequency that is associated with the first input signal is greater than a second frequency that is associated with the second input signal, the first reset signal includes a first parameter that is related to a difference between the first and second frequencies, and
      if the first frequency is less than the second frequency, the second reset signal includes a second parameter that is related to the difference between the first and second frequencies; and
   a tolerance circuit that is arranged to provide a status signal from the first and second input signals and the first and second reset signals such that the status signal corresponds to:
      a first logic level, if the difference between the first and second frequencies is within a tolerance window; and
      a second logic level, if the difference between the first and second frequencies is outside of the tolerance window.
2. The frequency comparator circuit of claim 1, wherein the first parameter includes at least one of a frequency of the first reset signal and a duty cycle of the first reset signal.
3. The frequency comparator circuit of claim 1, wherein the second parameter includes at least one of a frequency of the second reset signal and a duty cycle of the second reset signal.
4. The frequency comparator circuit of claim 1, wherein the first parameter includes a frequency of the first reset signal if the first frequency is relatively close to the second frequency.
5. The frequency comparator circuit of claim 1, wherein the second parameter includes the frequency of the second reset signal if the second frequency is relatively close to the first frequency.
6. The frequency comparator circuit of claim 1, wherein the detector circuit is a frequency detector circuit, wherein the frequency detector circuit is arranged such that the first and second reset signals are substantially independent of the phases of the first and second input signals.
7. The frequency comparator circuit of claim 1, wherein the detector circuit includes four flip-flops and a clear logic circuit.
8. The frequency comparator circuit of claim 1, wherein the detector circuit includes:
   a clear logic circuit that is arranged to activate a clear signal if a first intermediate signal and a second intermediate signal correspond to the first logic level, and arranged to deactivate the clear signal if at least one of the first intermediate signal and the second intermediate signal corresponds to the second logic level;
   a first flip-flop circuit that is arranged to set the first intermediate signal to the first logic level in response to the first input signal if the clear signal is deactivated, and arranged to reset the first intermediate signal to the second logic level if the clear signal is activated;
   a second flip-flop circuit that is arranged to set the second intermediate signal to the first logic level in response to the second input signal if the clear signal is deactivated, and arranged to reset the second intermediate signal to the second logic level if the clear signal is activated;

a third flip-flop circuit that is arranged to activate the first reset signal in response to the first input signal if the first intermediate signal corresponds to the first logic level, such that the first reset signal is activated if the first input signal pulses twice before the clear signal is activated; and a fourth flip-flop circuit that is arranged to activate the second reset signal in response to the second input signal if the second intermediate signal corresponds to the first logic level, such that the second reset signal is activated if the second input signal pulses twice before the clear signal is activated, wherein the first and second reset signals are related to the difference in frequencies between the first input signal and the second-input signal.

9. The frequency comparator circuit of claim 1, wherein the tolerance circuit includes:

a first counter circuit that is configured to generate a first count from the first input signal, to reset the first count if the first reset signal corresponds to an asserted logic level, and to provide a first overflow signal such that the first overflow signal is asserted if a first overflow condition has occurred, wherein the first overflow condition is related to the first count; and a second counter circuit that is configured to generate a second count from the second input signal, to reset the second count if the second reset signal corresponds to an asserted logic level, and to provide a second overflow signal such that the second overflow signal is asserted if a second overflow condition has occurred, wherein the second overflow condition is related to the second count.

10. The frequency comparator circuit of claim 9, further comprising:

a logic circuit that is configured to provide a status signal such that the status signal corresponds to:
  an asserted logic level, if the first and second overflow signals are both asserted, and
  a de-asserted logic level, if less than both of the first and second overflow signals are asserted.

11. The frequency comparator circuit of claim 9, wherein the first counter circuit is configured to store the first overflow condition, and wherein the second counter circuit is configured to store the second overflow condition.

12. A frequency comparator circuit, comprising:

a frequency detector circuit having at least first and second inputs, and first and second outputs;

a first counter circuit having at least a clock input that is coupled to the first input of the frequency detector circuit, and a clear input that is coupled to the first input of the frequency detector circuit;

a second counter circuit having at least a clock input that is coupled to the second input of the frequency detector circuit, and a clear input that is coupled to the second input of the frequency detector circuit.

13. The frequency comparator circuit of claim 12, further comprising an AND circuit that is coupled to the first and second counter circuits.

14. The frequency comparator circuit of claim 12, further comprising an AND gate having a first input that is coupled to an overflow output of the first counter circuit, and a second input that is coupled to an overflow output of the second counter circuit.

15. The frequency comparator circuit of claim 12, wherein the frequency detector circuit is configured to receive first and second input signals at the first and second inputs, a first frequency is associated with the first input signal, a second frequency is associated with a second input signal, and wherein the frequency detector circuit is further configured to provide first and second reset signals at the first and second outputs such that, if the first and second frequencies are relatively close:

if the first frequency is greater than the second frequency, the first reset signal includes a first parameter that is related to a difference between the first and second frequencies, and if the first frequency is less than the second frequency, the second reset signal includes a second parameter that is related to the difference between the first and second frequencies.

16. The frequency comparator circuit of claim 12, wherein the frequency detector circuit includes four flip-flops and a clear logic circuit.

17. The frequency comparator circuit of claim 12, wherein the first counter circuit includes:

a register circuit; and a flip-flop that is arranged to store an overflow condition related to the register circuit, and wherein the frequency comparator circuit further includes a delay circuit that is coupled between the clock input of the frequency detector circuit and the clock input of the register circuit.

18. The frequency comparator circuit of claim 12, wherein the frequency detector circuit includes:

a first flip-flop circuit having a clock input that is coupled to the clock input of the first counter circuit;

a second flip-flop circuit having a clock input that is coupled to the clock input of the second counter circuit;

a third flip-flop circuit having a clock input that is coupled to the clock input of the first counter circuit, another input that is coupled to an output of the first flip-flop circuit, and an output that is coupled to the clear input of the first counter circuit;

fourth flip-flop circuit having a clock input that is coupled to the clock input of the second counter circuit, another input that is coupled to an output of the second flip-flop circuit, and an output that is coupled to the clear input of the second counter circuit; and a clear logic circuit having a first input that is coupled to the output of the first flip-flop circuit, a second input that is coupled to the output of the second flip-flop circuit, and an output that is coupled to a clear input of the first flip-flop circuit, and further coupled to a clear input of the second flip-flop circuit.

19. The circuit of claim 18, wherein the clear logic circuit includes:

a delay circuit;

a NAND logic circuit that includes an input that is coupled to the output of the first flip-flop circuit, another input that is coupled to the output of the second flip-flop circuit, and an output that is coupled to an input of the delay circuit; and an inverter circuit that includes an input that is coupled to an output terminal of the delay circuit, and an output that is coupled to the clear input of the first flip-flop circuit.

20. A frequency comparator circuit, comprising:

means for providing first and second reset signals from first and second input signals such that:

if a first frequency that is associated with the first input signal is greater than a second frequency that is associated with the second input signal, the first reset signal includes a first parameter that is related to a difference between the first and second frequencies, and if the first frequency is less than the second frequency, the second reset signal includes a second parameter that is related to the difference between the first and second frequencies; and means for providing a status signal from the first and second input signals and the first and second reset signals such that the status signal corresponds to:
 a first logic level, if the difference between the first and second frequencies is less than a tolerance value; and
 a second logic level, if the difference between the first and second frequencies is greater than the tolerance value.

* * * * *

UNITED STATES PATENT AND TRADEMARK OFFICE
CERTIFICATE OF CORRECTION

PATENT NO. : 6,834,093 B1
DATED : December 21, 2004
INVENTOR(S) : Hon Kin Chiu

It is certified that error appears in the above-identified patent and that said Letters Patent is hereby corrected as shown below:

Column 3,
Line 45, delete "[fIN2-fiN])" and insert -- [fIN2-fIN1]) --.

Column 4,
Line 28, delete "1/FIN1" and insert -- 1/fIN1 --.
Line 38, delete "1/FIN2" and insert -- 1/fIN2 --.
Line 45, delete "arc" and insert -- are --.
Line 62, delete "(1/fIN2-1fIN1)" and insert -- (1/fIN2-1/fiN1) --.

Column 7,
Line 54, delete "second input" and insert -- second output --.
Lines 27 and 28, delete "the clock" and insert -- a clock --.

Signed and Sealed this

Nineteenth Day of July, 2005

JON W. DUDAS
*Director of the United States Patent and Trademark Office*